(12) United States Patent
Kaiwa et al.

(10) Patent No.: US 8,106,676 B2
(45) Date of Patent: Jan. 31, 2012

(54) SEMICONDUCTOR DEVICE

(75) Inventors: Nakaba Kaiwa, Tokyo (JP); Yutaka Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/691,215

(22) Filed: Jan. 21, 2010

(65) Prior Publication Data
US 2010/0188102 A1 Jul. 29, 2010

(30) Foreign Application Priority Data

Jan. 23, 2009 (JP) ................. 2009-013047

(51) Int. Cl.
*H03K 19/003* (2006.01)

(52) U.S. Cl. .......................... 326/30; 326/26

(58) Field of Classification Search ............ 326/30, 326/26–27
See application file for complete search history.

(56) References Cited

U.S. PATENT DOCUMENTS

| 7,656,186 B2* | 2/2010 | Osanai et al. ............. 326/30 |
| 7,800,398 B2* | 9/2010 | Lee et al. ................. 326/30 |
| 7,869,973 B2* | 1/2011 | Yoko et al. ............... 702/107 |

FOREIGN PATENT DOCUMENTS

JP  2008-048361  2/2008

* cited by examiner

*Primary Examiner* — James H Cho
(74) *Attorney, Agent, or Firm* — Young & Thompson

(57) ABSTRACT

A semiconductor device includes a signal generating circuit that generates an impedance adjustment command signal which indicates at least one of initiation and termination of an impedance adjustment. The semiconductor device outputs an output signal in synchronism with the impedance adjustment command signal.

18 Claims, 7 Drawing Sheets

US 8,106,676 B2

SEMICONDUCTOR DEVICE

BACKGROUND OF THE INVENTION

1. Field of the Invention

The present invention relates to a semiconductor device. More specifically, the present invention relates to a semiconductor device such as a DRAM (Dynamic Random Access Memory) having a calibration circuit for adjusting impedance of an output buffer included in an output circuit.

Priority is claimed on Japanese Patent Application No. 2009-013047, filed Jan. 23, 2009, the content of which is incorporated herein by reference.

2. Description of the Related Art

In a semiconductor device typically a DRAM, it is necessary to control distortion in a data transmission waveform caused due to reflection, wherein the control is made by adjusting impedance of a transmission system so as to perform high speed data transmission.

Such impedance adjustment is performed by adjusting impedance of an output buffer circuit using a so-called calibration circuit.

For example, Japanese Unexamined Patent Application, First Publication, No. 2008-48361 discloses a technique of adjusting impedance of an output buffer in a calibration period which is 64 times of an external clock cycle.

SUMMARY

In one embodiment, a semiconductor device may include, but is not limited to, a signal generating circuit that generates an impedance adjustment command signal which indicates at least one of initiation and termination of an impedance adjustment. The semiconductor device outputs an output signal in synchronism with the impedance adjustment command signal.

In another embodiment, a semiconductor device may include, but is not limited to, an output terminal connected to an output buffer; an impedance adjusting circuit that performs an impedance adjustment on the output buffer; and a signal generating circuit that generates an impedance adjustment start signal that activates the impedance adjusting circuit and an impedance adjustment termination signal that deactivates the impedance adjusting circuit. The impedance adjustment start signal and the impedance adjustment termination signal are supplied to the output terminal.

In still another embodiment, a method may include, but is not limited to, generating an impedance adjustment command signal; performing at least one of initiation and termination of an impedance adjustment on the output buffer; and producing an output signal in synchronism with the impedance adjustment command signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
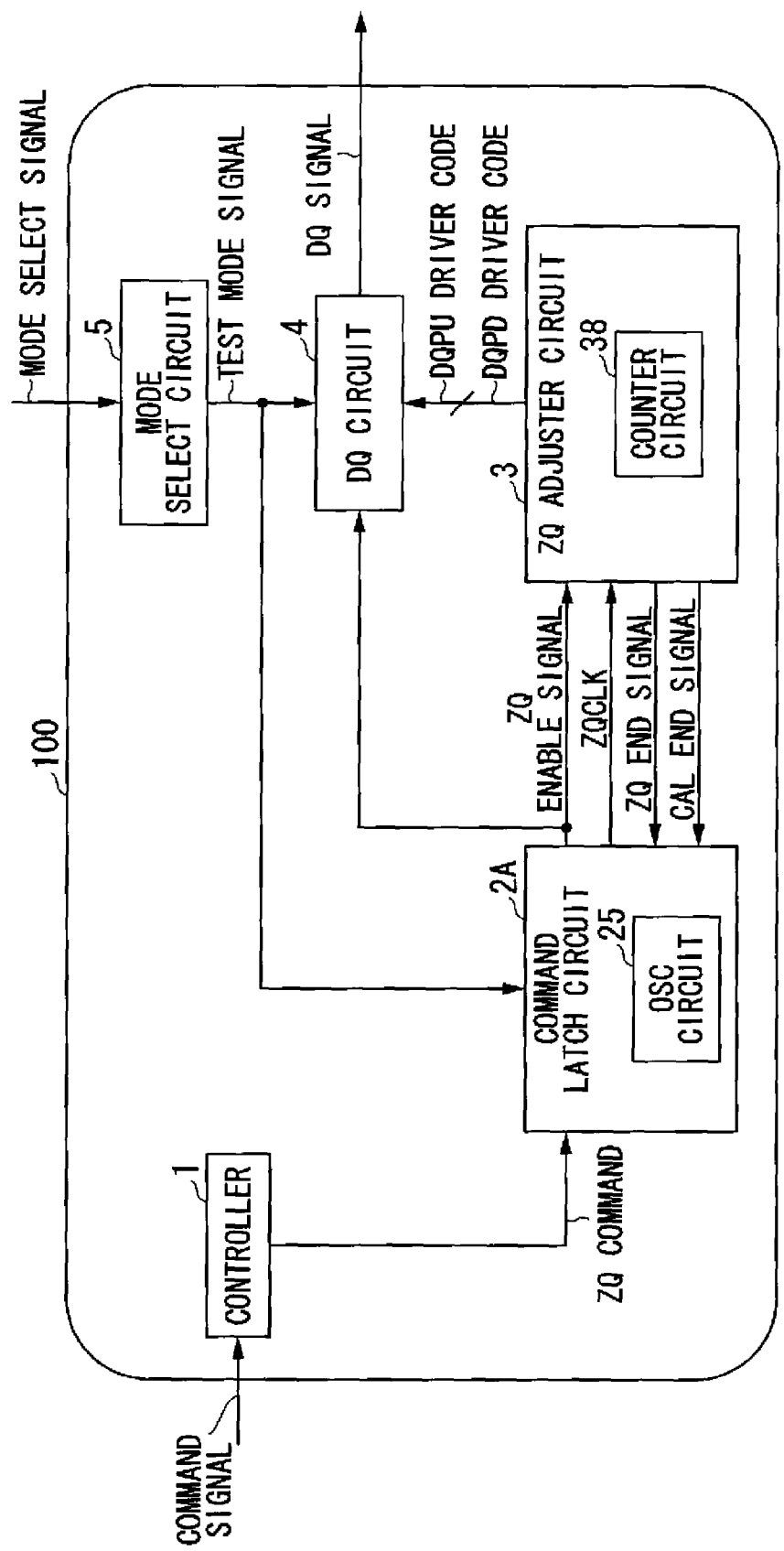
FIG. 1 is a bock diagram illustrating a semiconductor device in accordance with a first preferred embodiment of the present invention.

Before describing the present invention, the related art will be explained, in order to facilitate the understanding of the present invention.

In general, the calibration circuit may include, but is not limited to, a calibration terminal (ZQ terminals) and a comparator. The calibration terminal (ZQ terminal) is connected to a replica buffer circuit which has parallel connections to transistors. The comparator is connected to the calibration terminal (ZQ terminal). The comparator compares a voltage at the calibration terminal (ZQ terminal) to a reference voltage.

An external resistance is connected to the calibration terminal (ZQ terminal), so as to find out a combination of transistors so that the combined transistors is balanced against the external resistance. The result of combination is reflected to the output buffer circuit. Namely, the impedance of the output buffer circuit is set at a value based on the result of balancing the combined transistors against the external resistance.

Finding the transistor combination which forms the replica buffer circuit needs to take a calibration time period in which the comparator is allowed to perform the voltage comparison, and change or modification is made to the transistors in combination for the calibration circuit.

The calibration time period depends on the clock cycle of the external clock. As the frequency of the external clock becomes higher, the calibration time period becomes shorter, resulting in the difficulty to perform highly accurate adjustment of the impedance of the output buffer circuit.

In this point of view, there has been developed another method of operating an oscillator circuit based on an internal clock generated based on the external clock, so that the calibration circuit is operated by the output from the oscillator circuit.

In accordance with the other method, the calibration is performed by the output from the oscillator circuit. The cycle of the oscillator circuit will vary depending on the variations in manufacturing processes and operational situations, resulting in variation in the calibration time period. A test to check whether the calibration was properly performed is made by setting a longer calibration time period than a truly necessary time period which has been unknown. Setting the longer calibration time period than the truly necessary time period makes the test time period longer and also increases the test cost.

If the first-mentioned method is adopted to perform the calibration depending on the external clock, a truly necessary time period for the calibration is also unknown. It is also necessary to set a longer calibration time period than the truly necessary time period, resulting in making the test time period longer and also increasing the test cost.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

A semiconductor device may include, but is not limited to, an impedance adjusting circuit that generates a driver code which changes a driver size of an output buffer. The impedance adjusting circuit supplies the driver code to the output buffer. The semiconductor device may further include a signal generating circuit that generates impedance adjustment command signals which indicate start and termination of the impedance adjustment by the impedance adjusting circuit. The signal generating circuit supplies the impedance adjustment command signals to the impedance adjusting circuit. Signals synchronized with the impedance adjustment command signal are supplied to a terminal which is connected to the output buffer.

The signal generating circuit generates signals which indicate start and termination of the impedance adjustment by the impedance adjusting circuit. The output buffer supplies, to the terminal, the signals synchronized with the impedance adjustment command signal. The terminal is connected to the output buffer.

This circuit configuration of the semiconductor device allows a tester to measure transition times of transition of logic level of the signal at the terminal, wherein the signals are synchronized with the impedance adjustment command signal. The measurement of the transition times will determine start and end times of a calibration time period, thereby measuring the calibration time period. The measured calibration time period is used for performing calibration. The test to check whether the calibration was properly performed can be made by using the measured calibration time period. Setting the measured calibration time period which is the truly necessary time period can shorten the test time period and also decreases the test cost.

In one embodiment, a semiconductor device may include, but is not limited to, a signal generating circuit that generates an impedance adjustment command signal which indicates at least one of initiation and termination of an impedance adjustment. The semiconductor device outputs an output signal in synchronism with the impedance adjustment command signal. The semiconductor device may further include, but is not limited to, an impedance adjusting circuit that performs an impedance adjustment based on the impedance adjustment command signal from the signal generating circuit. The impedance adjusting circuit may generate a driver code which changes a driver size of the output buffer, the impedance adjusting circuit supplies the driver code to an output buffer. The semiconductor device may further include, but is not limited to, an output terminal connected to the output buffer. The semiconductor device supplies the output signals to the output terminal.

In some cases, the signal generating circuit may be configured to cause the impedance adjustment command signal to be transitioned from a first logic level to a second logic level, so as to activate the impedance adjusting circuit. The signal generating circuit may be configured to cause the impedance adjustment command signal to be transitioned from the second logic level to the first logic level, in response to a driver code generation termination signal given by the impedance adjusting circuit.

In some cases, the impedance adjusting circuit may include, but is not limited to, a driver code generating circuit that generates the driver code in response to a first clock given by the signal generating circuit. The impedance adjusting circuit may further include, but is not limited to, a replica buffer which includes a first plurality of transistors which are replicated to a second plurality of external transistors which forms the output buffer. The driver code generating circuit may be configured to adjust an impedance of the replica buffer. The driver code generating circuit may be configured to generate the driver code which is related to the results of the adjustment of the impedance. When the impedance of the replica buffer approaches a predetermined value, the driver code generating circuit generates the driver code to supply the driver code to the output buffer, while generating the driver code generation termination signal.

The driver code generating circuit may be configured to generate the driver code based on information related to the first plurality of transistors of the replica buffer.

In some cases, the impedance adjusting circuit may further include, but is not limited to, a control circuit that starts the impedance adjustment, in response to the transition of the impedance adjustment command signal from the first logic level to the second logic level. The control circuit may include, but is not limited to, a counter that counts the first clock up to a predetermined number. When the number counted by the counter reaches the predetermined number, the control circuit generates the driver code generation termination signal.

In some cases, the signal generating circuit may include, but is not limited to, an oscillator circuit that starts oscillation and generates the first clock, in response to the transition of the impedance adjustment command signal from the first logic level to the second logic level.

In some cases, the signal generating circuit may be configured to output the first clock, in synchronism with an external signal which is given cyclically and externally, after the transition of the impedance adjustment command signal from the first logic level to the second logic level.

In some cases, the signal generating circuit may be configured to generate the impedance adjustment command signal, in response to the test mode signal.

In some cases, the semiconductor device may further include, but is not limited to, an impedance adjusting circuit that performs an impedance adjustment on an output buffer. The signal generating circuit activates the impedance adjustment command signal in accordance with a start signal. The signal generating circuit deactivates the impedance adjustment command signal in accordance with a termination signal. The signal generating circuit outputs the impedance adjustment command signal to the output buffer.

In another embodiment, a semiconductor device may include, but is not limited to, an output terminal connected to an output buffer; an impedance adjusting circuit that performs an impedance adjustment on the output buffer; and a signal generating circuit that generates an impedance adjustment start signal that activates the impedance adjusting circuit and an impedance adjustment termination signal that deactivates the impedance adjusting circuit. The impedance adjustment start signal and the impedance adjustment termination signal are supplied to the output terminal.

The impedance adjusting circuit may be configured to generate a driver code which changes a driver size of the output buffer. The impedance adjusting circuit supplies the driver code to the output terminal.

The signal generating circuit may be configured to output output signals to the output terminal. The output signals are synchronized with at least one of the impedance adjustment start signal and the impedance adjustment termination signal.

In still another embodiment, a method may include, but is not limited to, generating an impedance adjustment command signal; performing at least one of initiation and termination of an impedance adjustment on the output buffer; and producing an output signal in synchronism with the impedance adjustment command signal.

The method may further include, but is not limited to, the following processes. A first impedance adjustment on a replica buffer is performed with reference to an external resistive element. A second impedance adjustment on an output impedance of the output buffer is performed.

First Embodiment

FIG. 1 is a block diagram illustrating a semiconductor device 100 according to a first embodiment of the invention.

Referring to FIG. 1, the semiconductor device 100 includes a control circuit 1, a command latch circuit 2A, a ZQ adjustment circuit 3, a DQ circuit 4, and a mode select circuit 5.

According to the present embodiment, the semiconductor device 100 performs impedance adjustment (for example, ZQ adjustment) between an internal replica buffer and an external resistor ER connected to a ZQ terminal when a calibration command is input. The DQ circuit 4 changes the driver size of the output buffer by reflecting the result of the adjustment. The DQ circuit 4 outputs, to the input/output pad, signals in synchronism with a signal (for example, the ZQEnable signal) representing start and termination of the impedance adjustment during an impedance adjustment period.

Hereinafter, this construction will be described in detail.

The control circuit 1 is a circuit for executing a desired operation in the semiconductor device 100 in response to a command input from an external device outside the semiconductor device 100.

Although not shown in FIG. 1, the command input may be determined by combining logic levels of signals such as CSB (Chip Select Bar), RASB (Row Address Strobe Bar), CASB (Column Address Strobe Bar), and WEB (Write Enable Bar) signals input to terminals of the semiconductor device 100 such as a DRAM.

The command input includes, for example, a read command or a write command for instructing to read and write data stored in a memory cell between a memory cell (not shown in FIG. 1) and the DQ circuit 4.

A calibration command is also input to the semiconductor device 100 as the command input. The control circuit 1 outputs the ZQ command to the command latch circuit 2A when the calibration command is input.

The command latch circuit 2A generates a ZQEnable signal and a clock signal ZQCLK in response to the logic levels of the ZQ command input from the control circuit 1 and the test mode signal input from the mode select circuit and outputs the ZQEnable signal to the ZQ adjustment circuit 3 and the DQ circuit 4 and the clock signal ZQCLK to the ZQ adjustment circuit 3.

The ZQ adjustment circuit 3 performs impedance adjustment (ZQ adjustment) between the internal replica buffer and the external resistor ER connected to the ZQ terminal in synchronism with the input clock signal ZQCLK when the ZQEnable signal is input and outputs the result of this adjustment to the DQ circuit 4 as a DQPU driver code and a DQPD driver code to perform output impedance adjustment of the DQ circuit 4.

The ZQ adjustment circuit 3 outputs, to the command latch circuit 2A, a ZQ end signal and a CAL end signal when an internal counter circuit 38 counts the ZQCLK signal up to a predetermined number of clocks and when completion of the ZQ adjustment is received, respectively.

The DQ circuit 4 inputs or outputs data between the input/output pin and the memory cell (not shown in FIG. 1).

The DQ circuit 4 modifies the driver size of the output buffer and adjusts the output impedance based on the DQPU driver code and the DQPD driver code input from the ZQ adjustment circuit 3 as will be described later. The DQ circuit 4 outputs data from the memory cell to the input/output pin with the output impedance being adjusted in an operation responding to the read command.

Meanwhile, in the test mode operation of the present embodiment, the DQ circuit 4 outputs a signal synchronized with the ZQEnable signal to the input/output pin.

The mode select circuit 5 receives a mode select signal from an external unit outside the semiconductor device 100 and generates a test mode signal.

It is noted that the mode select signal may be input from a dedicated test terminal. For example, if this construction is applied to a DRAM, the test mode signal may be generated by combining the logic levels of the aforementioned test command input and an address input from an external address terminal (not shown in FIG. 1).

The mode select circuit 5 outputs the test mode signal to the command latch circuit 2A and the DQ circuit 4.

Figure 2:
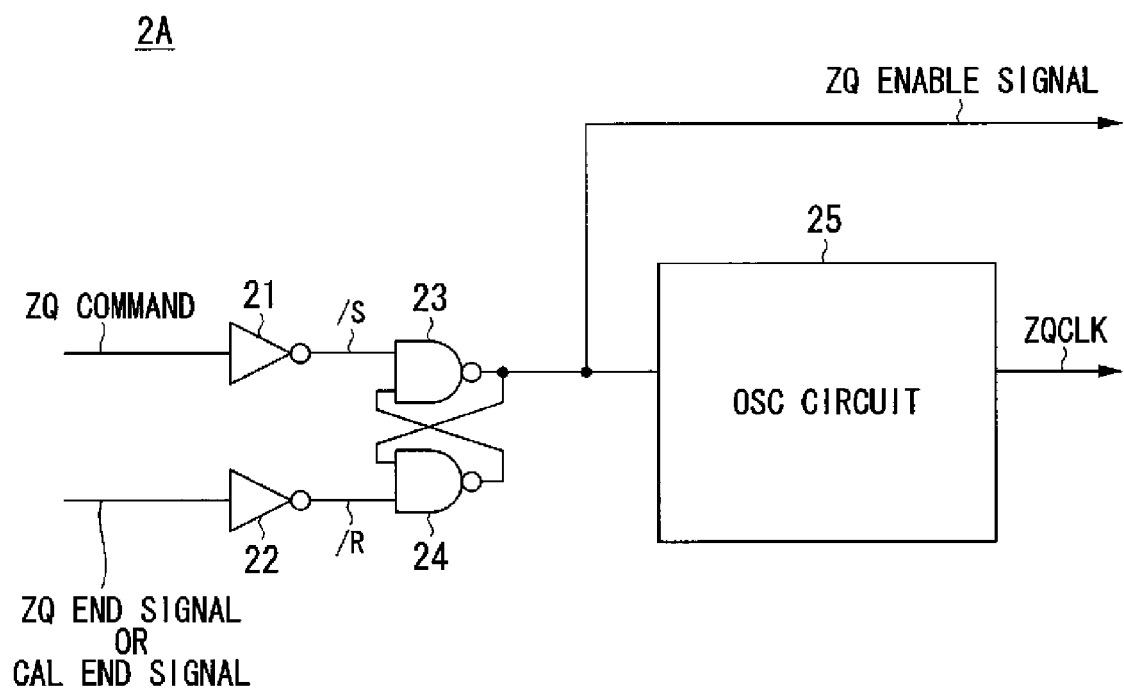
FIG. 2 is a block diagram illustrating a command latch circuit included in the semiconductor device of FIG. 1.

FIG. 2 is a block diagram illustrating a command latch circuit 2A in the semiconductor device 100 of FIG. 1. Referring to FIG. 2, the command latch circuit 2A includes inverter circuits 21 and 22, NAND circuits 23 and 24, and an OSC circuit 25.

The inverter circuit 21 receives the ZQ command and outputs a set bar signal /S obtained by logically inverting the ZQ command.

The inverter circuit 22 receives the ZQ end signal or the CAL end signal and outputs a reset bar signal /R obtained by logically inverting the ZQ end signal or the CAL end signal.

Which one of the ZQ end signal and the CAL end signal is input to the inverter circuit 22 is determined by the test mode signal.

The NAND circuit 23 is a negative AND logic circuit which receives the set bar signal /S and the output of the NAND circuit 24 and outputs the ZQEnable signal.

The NAND circuit 24 is a negative AND logic circuit which receives the ZQEnable signal and the reset bar signal /R and has an output terminal connected to the input of the NAND circuit 23.

The NAND circuits 23 and 24 constitute an RS (Reset/Set) flip-flop.

In other words, when the logic level of input of the set bar signal /S in FIG. 2 is transited from 1 to 0, the logic level of the ZQEnable signal as an output is transited from 0 to 1.

Meanwhile, when the logic level of the ZQEnable signal is 1, and the logic level of the /R input is transited from 1 to 0, the logic level of the ZQEnable signal as an output is transited from 1 to 0.

The OSC (oscillator) circuit 25 is, for example, a ring oscillator circuit.

The ring oscillator circuit includes an odd number of inverter circuits having a ring structure in which each output terminal of the inverters is input to an input terminal of another inverter in chains, and the output terminal of the final stage inverter is connected to the input terminal of the initial stage inverter.

In this case, since each inverter circuit has a limited delay time, the final stage inverter outputs a signal obtained by logically negating the input of the initial stage inverter after a limited delay time from the input of the initial stage inverter, and the output of the final stage inverter is input to the initial stage inverter again. The ring oscillator circuit is oscillated by repeating this process.

In this manner, the command latch circuit 2A shown in FIG. 2 outputs the ZQEnable signal when the ZQ command is input and stops outputting the ZQEnable signal when the ZQ end signal or the CAL end signal is input.

When the ZQEnable signal is input, the oscillator circuit is oscillated to periodically generate the ZQCLK signal and outputs the ZQCLK signal to the ZQ adjustment circuit 3.

Figure 3:
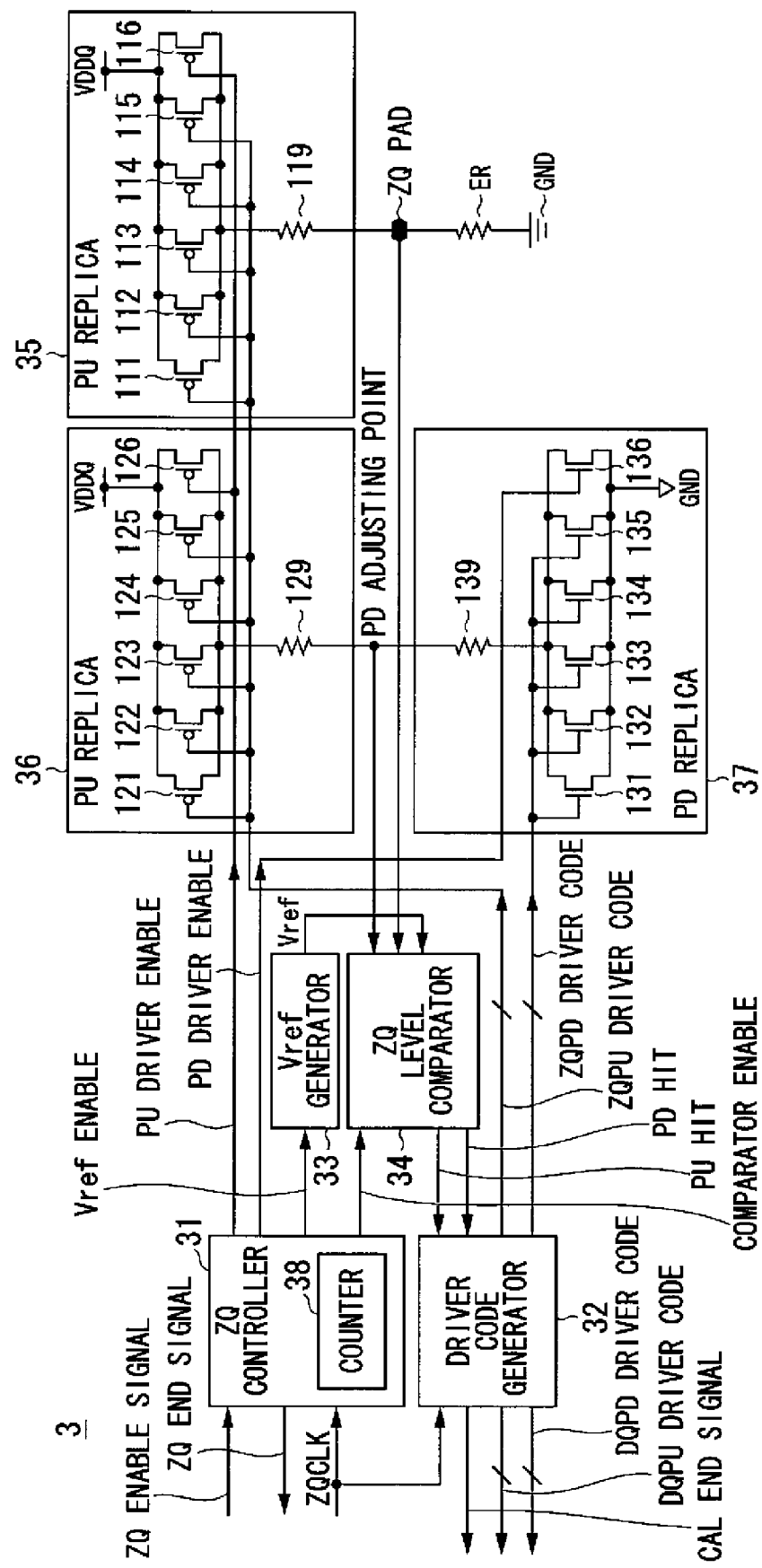
FIG. 3 is a block diagram illustrating a ZQ adjustment circuit included in the semiconductor device of FIG. 1.

FIG. 3 is a block diagram illustrating the ZQ adjustment circuit 3 in the semiconductor device 100 of FIG. 1.

Referring to FIG. 3, the ZQ adjustment circuit 3 includes a ZQ control circuit 31, a driver code generating circuit 32, a Vref generator 33, a ZQ level comparator 34, PU replicas 35 and 36, and a PD replica 37. The ZQ adjustment circuit 3 performs impedance adjustment (ZQ adjustment) between an internal replica buffer and an external resistor ER connected to the ZQ terminal and outputs the result of the adjustment as the DQPU driver code and the DQPD driver code to the DQ circuit 4 to perform output impedance adjustment of the DQ circuit 4.

The ZQ control circuit 31 outputs a Vref enable signal, a comparator enable signal, a PU driver enable signal, and a PD driver enable signal to the Vref generator 33, the ZQ level comparator 34, the PU replicas 35 and 36, and the PD replica 37, respectively, when the ZQEnable signal is input. The ZQ control circuit 31 performs control to initiate adjustment for approximating the resistance value of the external resistor ER connected to the ZQ pad and the ON resistance values of each replica to each other (ZQ adjustment).

The ZQ control circuit 31 includes a counter circuit 38, which counts the clock number of the ZQCLK signal. When the count number reaches a predetermined number set in the counter, the ZQ end signal is output to the command latch circuit 2A. It is noted that the count number set in the counter is determined based on the number of changing the ZQ driver code which is output from the driver code generating circuit 32 to the replica circuit, which will be described later. For example, if the replica buffer is controlled to be turned on/off using 5 transistors during the impedance adjustment, the count number is set to $2^5=32$. When the clock number of the clock signal ZQCLK reaches 32, the counter circuit outputs the ZQ end signal to the command latch circuit 2A.

The driver code generating circuit 32 outputs the ZQ driver code (for example, the ZQPU driver code or the ZQPD driver code) to the PU replicas 35 and 36 and the PD replica 37 in response to input of the clock signal ZQCLK, for example, in synchronism with the rising edge of the clock signal ZQCLK input in a time series to change the output impedance of the replica circuit.

The driver code generating circuit 32 outputs the CAL end signal which is the ZQ adjustment termination signal to the command latch circuit 2A and also outputs the DQPU driver code and the DQPD driver code to the DQ circuit 4 when the adjustment of the PU replica 36 and the PD replica 37 is completed, for example, when both a PU hit signal and a PD hit signal are input from the ZQ level comparator 34.

The Vref generator 33 outputs a reference voltage Vref to the ZQ level comparator 34 when the Vref enable signal is input from the ZQ control circuit 31.

It is noted that the potential of the reference voltage Vref is an intermediate voltage between the potential of the power VDDQ terminal to which the PU replicas 35 and 36 are connected and a ground potential to which the PD replica 37 is connected.

The ZQ level comparator 34 receives the aforementioned reference voltage Vref and compares the reference voltage Vref with the potential at the ZQ pad or the potential at the PD adjustment node.

When the reference voltage Vref and the potential at the PD adjustment node are close to each other, both the PU hit signal and the PD hit signal are sequentially output to the driver code generating circuit 32.

The PU replica 35 includes 6 P-channel MOS transistors 111 to 116 connected in parallel to the power voltage VDDQ and a resistors 119 of which one end is connected to the drains of the transistors 111 to 116.

The other end of the resistor 119 is connected to the ZQ pad which is a calibration terminal.

The gate lengths L and the gate widths W of the P-channel MOS transistors 111 to 116 are equal to those of the P-channel MOS transistors 221 to 226 included in the PU circuit 46 of the DQ circuit 4, which will be described later.

The resistance value of the resistor 119 is equal to the resistance value of the resistor 129 included in the PU circuit 46. While the number of the P-channel MOS transistors included in the PU replica 35 is set to 6 in the present embodiment, it may be set to any number without limitation.

The ZQPU driver code is input from the driver code generating circuit 32 to the gate terminals of the P-channel MOS transistors 111 to 115, whereas the PU driver enable signal is input from the ZQ control circuit 31 to the gate terminal of the P-channel MOS transistor 116. Since the ZQPU driver code collectively represents 5 signals, the P-channel MOS transistors 111 to 115 are individually turned on/off by these signals.

To adjust the impedance minutely in a wide range, it is preferable that a plurality of transistors constituting a parallel circuit have a different W/L ratio (a ratio between the gate width W and the gate length L). For example, if the W/L ratio of the P-channel MOS transistor 116 is equal to "1," the W/L ratios of the P-channel MOS transistors 111 to 115 may be set to "2," "4," "8," "16," and "32," respectively.

By appropriately selecting the P-channel MOS transistors 111 to 115 turned on by the ZQPU driver code, it is possible to approximate the ON resistance of the PU replica 35 having the resistor 119 and the ON resistor of the parallel circuit to the resistance value of the external resistor ER connected to the ZQ pad irrespective of deviation in manufacturing conditions or temperature change.

In other words, for example, assuming that the resistance value of the resistor 119 is designed to 120Ω, and the resistance value of the external resistor ER is 240Ω, the parallel circuit including the P-channel MOS transistors 111 to 116 is in an ON state, and thus, the logic level of the ZQPU driver code is determined such that the ON resistance becomes 120Ω.

The PU replica 36 has a similar circuit construction to the PU replica 35 except that the other end of the resistor 129 is connected to the PD adjustment node.

The lengths L and the widths W of the P-channel MOS transistors 121 to 126 are equal to those of the P-channel MOS transistors 111 to 116. Further, the resistance value of the resistor 129 is equal to that of the resistor 119.

Similarly to the PU replica 35, the ZQPU driver code and the PU driver enable signal are input to gate terminals of the six P-channel MOS transistors 121 to 126 included in the PU replica 36.

Therefore, the PU replica 36 is used in the impedance adjustment of the PD replica 37 by directly reflecting the result of the impedance adjustment of the PU replica 35.

The PD replica 37 includes six N-channel MOS transistors 131 to 136 connected in parallel to the ground voltage GND and a resistor 139 of which one end is connected to the drains of the N-channel MOS transistors 131 to 136. The other end of the resistor 139 is connected to the PD adjustment node.

The gate lengths L and the gate widths W of the N-channel MOS transistors 131 to 136 are equal to those of the N-channel MOS transistors 231 to 236 included in the PD circuit 47 of the DQ circuit 4 which will be described later. The resistance value of the resistor 139 is equal to that of the resistor 239 included in the PD circuit 47.

The ZQPD driver code is input from the driver code generating circuit 32 to the gate terminals of the N-channel MOS transistors 131 to 135, and the PD driver enable signal is input from the ZQ control circuit 31 to the gate terminal of the N-channel MOS transistor 136. Since the ZQPD driver code collectively represents 5 signals, the N-channel MOS transistors 131 to 135 are individually controlled to be turned on/off based on these signals.

By appropriately selecting the N-channel MOS transistors 131 to 135 turned on by the ZQPD driver code, it is possible to approximate the ON resistance value of the PD replica 37 and the ON resistance value of the PU replica 36 to each other.

Since the ON resistance value of the PU replica 36 is close to the ON resistance value of the PU replica 35, it is possible to approximate the ON resistance value of the PD replica 37 to the resistance value of the external resistor ER.

In this manner, in the ZQ adjustment circuit 3 shown in FIG. 3, the ZQ control circuit 31 initiates the ZQ adjustment when the logic level of the ZQEnable signal is transited from 0 to 1.

Specifically, the ZQ control circuit 31 outputs the Vref enable signal to the Vref generator 33. Further, the ZQ control circuit 31 outputs the comparator enable signal to the ZQ level comparator 34.

The ZQ level comparator 34 compares the potential of the reference voltage Vref with the potential of the ZQ pad to determine the logic level of the ZQPU driver code input to the PU replica 35 and outputs the PU hit signal to the driver code generating circuit 32.

The ZQ level comparator 34 compares the potential of the PD adjustment node with the potential of the reference voltage Vref to determine the logic level of the ZQPD driver code input to the PD replica 37 and outputs the PD hit signal to the driver code generating circuit 32.

The ZQ control circuit 31 has a counter circuit which counts the clock signal ZQCLK. When the count number reaches a predetermined number, the ZQ control circuit 31 outputs the ZQ end signal to the command latch circuit 2A.

The driver code generating circuit 32 updates the PU driver code in response to the clock signal ZQCLK until the PU hit signal is input. Similarly, the driver code generating circuit 32 updates the PD driver code in response to the clock signal ZQCLK until the PD hit signal is input.

When the adjustment is terminated (when both the PU hit signal and the PD hit signal are input), the driver code generating circuit 32 outputs the CAL end signal to the command latch circuit 2A and outputs the DQPU driver code and the DQPD driver code to the DQ circuit 4.

Figure 4:
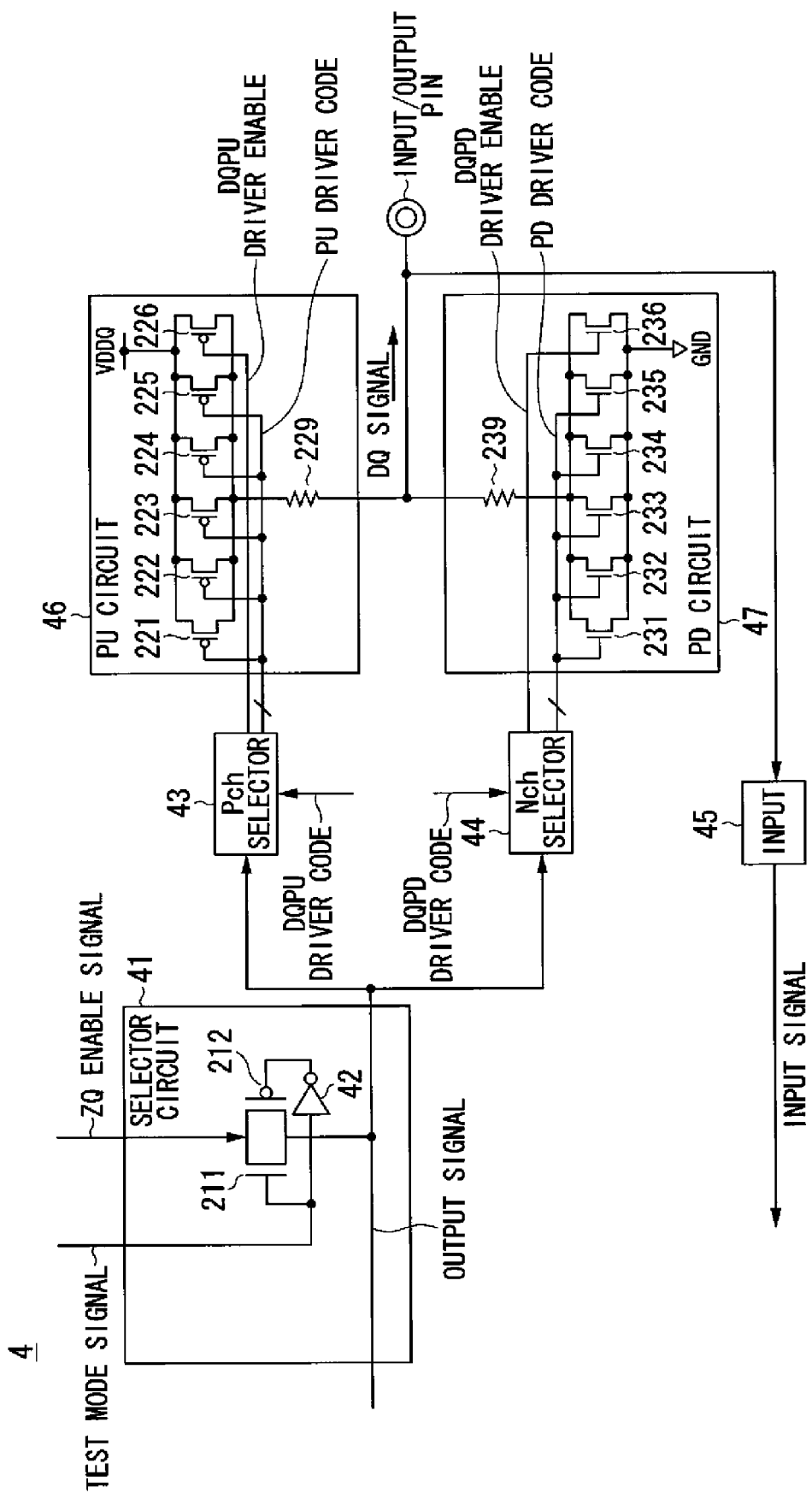
FIG. 4 is a block diagram illustrating a DQ circuit included in the semiconductor device of FIG. 1.

FIG. 4 is a block diagram illustrating the DQ circuit 4 in the semiconductor device 100 of FIG. 1. Referring to FIG. 4, the DQ circuit includes a selector circuit 41, a Pch selection circuit 43, an Nch selection circuit 44, an input circuit 45, a PU circuit 46, and a PD circuit 47.

The selector circuit 41 includes an N-channel MOS transistor 211, a P-channel MOS transistor 212, and an inverter circuit 42.

The test mode signal, the ZQEnable signal, and an output signal are input to the gate terminal, the drain terminal, and the source terminal, respectively, of the N-channel MOS transistor 211. It is noted that the output signal is a signal for outputting data 0 or 1 stored in a memory cell (not shown in FIG. 4) to the input/output pin.

An output signal of the inverter circuit 42, the ZQEnable signal, and an output signal are input to the gate terminal, the source terminal, and the drain terminal, respectively, of the P-channel MOS transistor 212. The inverter circuit 42 is a logic circuit for inverting the logic level of the test mode signal.

In a normal read operation, since the logic level of the test mode signal is 0, the selector circuit 41 turns off both the N-channel and P-channel MOS transistors 211 and 212.

Meanwhile, in a test mode operation, since the logic level of the test mode signal is 1, the selector circuit 41 turns on both the N-channel and P-channel MOS transistors 211 and 212 so that the ZQEnable signal becomes the output signal. Therefore, the ZQEnable signal is input to the Pch selection circuit 43 and the Nch selection circuit 44.

The Pch selection circuit 43 receives the aforementioned output signal and the DQPU driver code and outputs the PU driver code and the DQPU driver enable signal which is used to control the ON or OFF state of the P-channel MOS transistor included in the PU circuit 46 in response to the logic level of the output signal.

The Nch selection circuit 44 receives the aforementioned output signal and the DQPD driver code and outputs the PD driver code and the DQPD driver enable signal which is used to control the ON or OFF state of the N-channel MOS transistor included in the PD circuit 47 in response to the logic level of the output signal.

The input circuit 45 outputs an input signal in the write operation of the semiconductor device 100 in response to the logic level of the input/output pin. It is noted that the input signal is a signal for storing data 0 or 1 in a memory cell (not shown in FIG. 4).

The PU circuit 46 includes 6 P-channel MOS transistors 221 to 226 connected in parallel to the power voltage VDDQ and a resistor 229 of which one end is connected to the drains of these transistors 221 to 226. Further, the other end of the resistor 229 is connected to the input/output pin.

The gate lengths L and the gate widths W of the P-channel MOS transistors 221 to 226 are equal to those of the P-channel MOS transistors 121 to 126 included in the PU replica 36 of the ZQ adjustment circuit 3. The resistance value of the resistor 229 is equal to that of the resistor 129 included in the PU replica 36.

The PU driver code and the DQPU driver enable signal are input from the Pch selection circuit 43 to the gate terminals of the P-channel MOS transistors 221 to 226. In this case, the P-channel MOS transistors 221 to 225 are controlled to be turned on/off by the PU driver code in response to the DQPU driver code reflecting the result of the impedance adjustment in the ZQ adjustment circuit 3.

The PD circuit 47 includes 6 N-channel MOS transistors 231 to 236 connected in parallel to the ground voltage GND and a resistor 239 of which one end is connected to the drains of these transistors 231 to 236. Further, the other end of the resistor 239 is connected to the input/output pin.

The gate lengths L and the gate widths W of the N-channel MOS transistors 231 to 236 are equal to those of the N-channel MOS transistors 131 to 136 included in the PD replica 37 in the ZQ adjustment circuit 3. Further, the resistance value of the resistor 239 is equal to that of the resistor 139 included in the PD replica 37.

The PD driver code and the DQPD driver enable signal are input from the Nch selection circuit 44 to the gate terminals of the N-channel MOS transistors 231 to 236.

In this case, the N-channel MOS transistors 231 to 235 are controlled to be turned on or off by the PD driver code in response to the DQPD driver code reflecting the result of the impedance adjustment in the ZQ adjustment circuit 3.

In this manner, in a normal read operation, the DQ circuit 4 outputs the DQ signal having a logic level 0 to the input/output pin by turning on any N-channel MOS transistors 231 to 235 to which a signal having a logic level equal to 1 of the PD driver code is input and the N-channel MOS transistor 236 when the data stored in the memory cell is 0.

When the data stored in the memory cell is 1, the DQ signal having a logic level equal to 1 is output to the input/output pin by turning on the P-channel MOS transistor 226 and any P-channel MOS transistors 221 to 225 to which a signal having a logic level equal to 0 out of the PU driver code is input.

Meanwhile, in a test mode operation, the DQ circuit 4 outputs the DQ signal having a logic level corresponding to the logic level of the ZQEnable signal to the input/output pin.

Returning to FIG. 1, the test mode operation of the semiconductor device 100 will be described with reference to FIG. 5.

Figure 5:
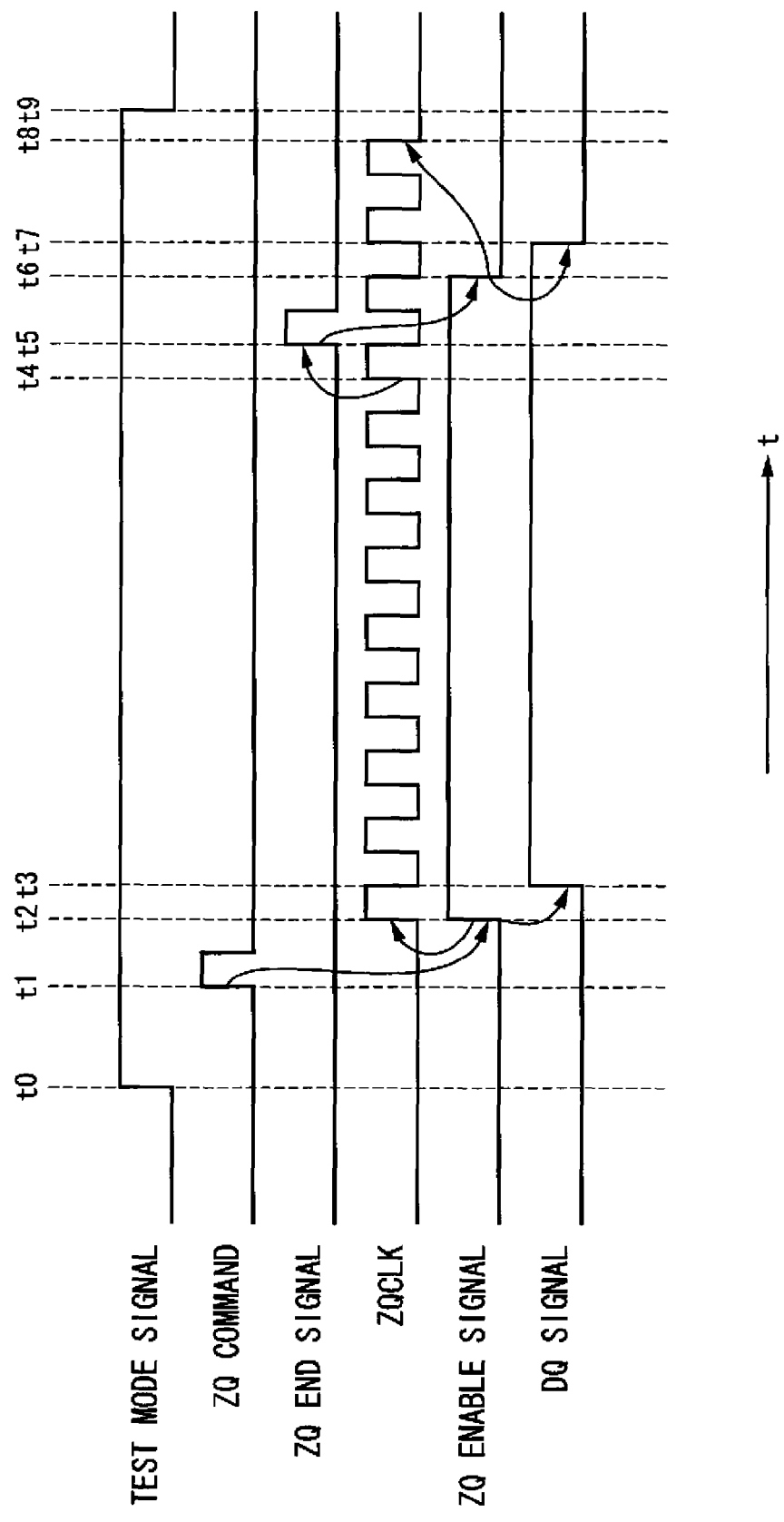
FIG. 5 is a timing chart illustrating waveforms of signals involved in operations of the semiconductor device of FIG. 1.

FIG. 5 is a timing chart illustrating operations of the main signals in the semiconductor device 100 of FIG. 1. Referring to FIG. 5, the logic levels of the main signals are transited between 0 and 1 as time elapses.

FIG. 5 is a timing chart when the ZQ end signal is input to the inverter circuit 22 in the command latch circuit 2A.

In an initial state, the logic levels of all the signals shown in FIG. 5 are equal to 0.

At the timing t0, the mode select circuit 5 transits the logic level of the test mode signal from 0 to 1.

As a result, the selector circuit 41 of the DQ circuit 4 sets the logic level of the output signal to 0 which is equal to the logic level of the ZQEnable signal because the N-channel MOS transistor 211 and the P-channel MOS transistor 212 are turned on.

Accordingly, the Nch selection circuit 44 sets the logic level of at least the DQPD driver enable signal out of its output to 1. Then, out of the N-channel MOS transistors 231 to 236 of the PD circuit 47, at least the N-channel MOS transistor 236 is turned on to set the logic level of the DQ signal output to the input/output pin to 0.

Subsequently, with the logic level of the test mode signal being 1, at the timing t1, the control circuit 1 transits the logic level of the ZQ command from 0 to 1 in response to an external command signal.

The command latch circuit 2A transits the logic level of the ZQEnable signal from 0 to 1 by transiting the logic level of the /S input of the NAND circuit 23 from 1 to 0 using the inverter circuit 21.

Subsequently, the OSC circuit 25 initiates oscillation and periodically generates the clock signal ZQCLK after the timing t2.

In FIG. 5, the ZQ command is, so called, a one-shot pulse. The logic level of the ZQ command is returned to 0 before the timing t2, and the logic level of the /S input of the NAND circuit 23 is returned to 1.

However, in the NAND circuit 24, since the logic level of the ZQEnable signal is equal to 1, both the logic levels of two input signals become 1. For this reason, the NAND circuit 24 sets the logic level of the other input signal of the NAND circuit 23 to 0. Therefore, the NAND circuit 23 keeps the logic level of the ZQEnable signal in 1.

In the ZQ adjustment circuit 3, the ZQ control circuit 31 starts to count the clock signal ZQCLK using an internal counter circuit 38. The ZQ control circuit 31 receives the transition of the logic level of the ZQEnable signal and activates the Vref generator 33 and the ZQ level comparator 34. In addition, the ZQ control circuit 31 sets the logic level of the PU driver enable signal to 0 and turns on the P-channel MOS transistor 116 of the PU replica 35.

The driver code generating circuit 32 changes the ZQPU driver code, for example, the logic levels of 5 signals (corresponding to 5 bits) input to the gate terminals of the P-channel MOS transistors 111 to 115 whenever the clock signal ZQCLK is input after the timing t2.

The ZQ level comparator 34 determines the logic level of the PU hit signal based on the potential comparison between the potential of the ZQ pad and the potential of the reference voltage Vref (0.5×VDDQ). This data of 5 bits when a hit is generated becomes the data of the DQPU driver code.

Then, the ZQ level comparator changes the ZQPD driver code, for example, the logic levels of 5 signals (corresponding to 5 bits) input to the gate terminals of the N-channel MOS transistors 131 to 135 whenever the clock signal ZQCLK is input. In addition, before initiating the change, the ZQ control circuit 31 transits the logic level of the PD driver enable signal to 1 and turns on the N-channel MOS transistor 136 of the PD replica 37.

The ZQ level comparator 34 determines the logic level of the PD hit signal based on the potential comparison between the potential of the PD adjustment node and the potential of the reference voltage Vref (0.5×VDDQ). This data of 5 bits when a hit is generated becomes the data of the DQPD driver code. In addition, since the ON resistance values of the PU replica 35 and the PU replica 36 are close to each other, the ON resistance value of the PD replica 37 when a hit is generated is close to the resistance value of the external resistor ER.

The driver code generating circuit 32 outputs the CAL end signal when both the PU hit signal and PD hit signal are input. When the CAL end signal is input to the command latch circuit 2A, the logic level of the ZQEnable signal is transited as will be described below. However, since the ZQ end signal is input herein, the command latch circuit 2A keeps the logic level of the ZQEnable signal in 1.

The driver code generating circuit 32 outputs the DQPU driver code and the DQPD driver code determined as described above to the Pch selection circuit 43 and the Nch selection circuit 44, respectively, of the DQ circuit 4.

In the DQ circuit 4, the selector circuit 41 transits the logic level of the output signal from 0 to 1 at the timing t2.

Accordingly, the Nch selection circuit 44 sets, to 0, a signal having a logic level 1 out of the signals input to the gate terminals of the N-channel MOS transistors 231 to 236 to turn off the N-channel MOS transistors 231 to 236.

Meanwhile, the Pch selection circuit 43 sets, to 0, the logic level of at least the DQPU driver enable signal out of its output signals. Then, the P-channel MOS transistor 226 of the PU circuit 46 is turned on so that the logic level of the DQ signal output to the input/output pin is transited to 1.

At the timing t4, the counter circuit 38 included in the ZQ adjustment circuit 3 counts the clock signal ZQCLK up to a predetermined count number and then terminates.

Accordingly, the ZQ adjustment circuit 3 transits the logic level of the ZQ end signal from 0 to 1 at the timing t5. While the ZQ adjustment circuit 3 outputs the ZQ end signal in response to the 9th count of the clock signal ZQCLK in FIG. 5, the predetermined count number may be arbitrarily set without limitation.

In the command latch circuit 2A, when the logic level of the ZQ end signal is transited to 1, the logic level of the /R input of the NAND circuit 24 is transited from 1 to 0, and the logic level of the output signal of the NAND circuit 24 is transited to 1. Meanwhile, as described above, the logic level of the /S input which is the other input of the NAND circuit 23 is equal to 1.

As a result, since the logic levels of both input signals of the NAND circuit 23 are equal to 1 at the timing t6, the logic level of the ZQEnable signal is transited from 1 to 0.

In the DQ circuit 4, the selector circuit 41 transits the logic level of the output signal to 0 when the logic level of the ZQEnable signal is transited to 0.

Accordingly, the Pch selection circuit 43 sets, to 1, a signal having a logic level equal to 0 out of the signals input to the gate terminals of the P-channel MOS transistors 221 to 226 to turn off the P-channel MOS transistors 221 to 226.

Meanwhile, the Nch selection circuit 44 sets, to 1, the logic level of at least the DQPU driver enable signal out of its outputs. As a result, the N-channel MOS transistor 236 of the PD circuit 47 is turned on so that the logic level of the DQ signal output to the input/output pin is transited to 0.

The OSC circuit 25 stops oscillation at the timing t8 when the logic level of the ZQEnable signal is transited to 0.

In addition, at the timing t9, the mode select circuit 5 transits the logic level of the test mode signal from 1 to 0.

Accordingly, the selector circuit 41 included in the DQ circuit 4 makes the logic level of the output signal independent on the logic level of the ZQEnable signal by turning off the N-channel MOS transistor 211 and the P-channel MOS transistor 212. In other words, the DQ circuit 4 is allowed to prepare a normal read operation.

In this manner, the semiconductor device 100 according to the present embodiment has an impedance adjustment circuit (for example, the ZQ adjustment circuit 3) which generates a driver code (for example, the DQPU driver code and the DQPD driver code) for changing the driver size of the output buffer (for example, the PU circuit 46 and the PD circuit 47) and outputs the driver code to the output buffer (for example, the PU circuit 46 and the PD circuit 47). In addition, the semiconductor device 100 according to the present embodiment has a signal generating circuit (for example, the command latch circuit 2A) which generates an impedance adjustment command signal (for example, the ZQEnable signal) indicating start and termination of the impedance adjustment in the impedance adjustment circuit (for example, the ZQ adjustment circuit 3) so that a signal synchronized with the impedance adjustment command signal for example, the ZQEnable signal) is output to the output terminal (for example, the input/output pin) connected to the output buffer (for example, the PU circuit 46 and the PD circuit 47).

As a result, it is possible to measure a calibration period (for example, an impedance adjustment period) while the logic level of the signal (DQ signal) output to the output terminal (for example, the input/output pin) connected to the output buffer circuit (for example, the PU circuit 46 and the PD circuit 47) remains in 1 (for example, at the timing t3 to t7 in FIG. 5), for example, by measuring a potential change in the input/output pin using a tester.

Furthermore, since the count number of the counter circuit 38 is a setup value, it is possible to obtain the oscillation cycle of the oscillator (for example, the OSC circuit 25) by subtracting the calibration period from the count number.

While the ZQ end signal is input by the test mode signal in the aforementioned command latch circuit 2A, the CAL end signal which is output from the drive code generating circuit 32 may be input by the test mode signal.

Figure 6:
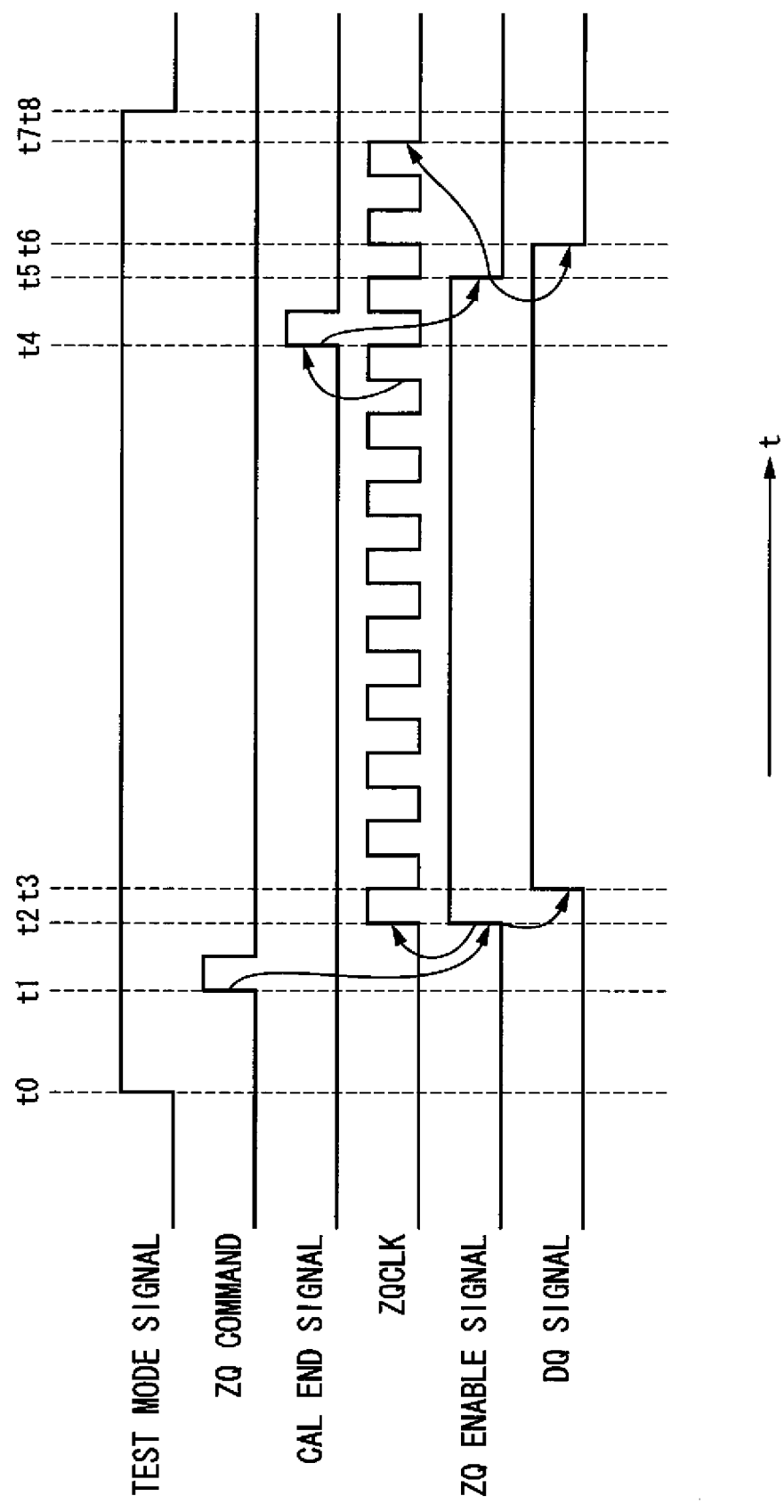
FIG. 6 is a timing chart illustrating waveforms of signals involved in operations of the semiconductor device of FIG. 1.

FIG. 6 is a timing chart illustrating operations of main signals when the CAL end signal is input to the inverter circuit 22 of the command latch circuit 2A. FIG. 6 shows that the logic levels of main signals are transited between 0 and 1 as time elapses.

Hereinafter, operations of the semiconductor device 100 will be described with reference to FIG. 6.

The operations at the timing t0 to t3 in FIG. 6 are similar to those at the timing t0 to t3 that have been already described in conjunction with FIG. 5, and descriptions thereof will be omitted.

The driver code generating circuit 32 transits the logic level of the CAL end signal from 0 to 1 when both the PU hit signal and the PD hit signal are input at the timing t4.

In the command latch circuit 2A, the logic level of the /R input of the NAND circuit 24 is transited from 1 to 0 when the logic level of the CAL end signal is transited to 1, so that the NAND circuit 24 transits the logic level of the output signal to 1.

As a result, since both input signals of the NAND circuit 23 have a logic level equal to 1 at the timing t5, the logic level of the ZQEnable signal is transited from 1 to 0.

The operations after the timing t6 are similar to the operations after the timing t7 as described in conjunction with FIG. 5, and descriptions thereof will be omitted.

As a result, even when the CAL end signal is input to the inverter circuit 22 of the command latch circuit 2A, it is still possible to measure the calibration period (for example, the impedance adjustment period) as described above.

Second Embodiment

Subsequently, a second embodiment of the present invention will be described.

Figure 7:
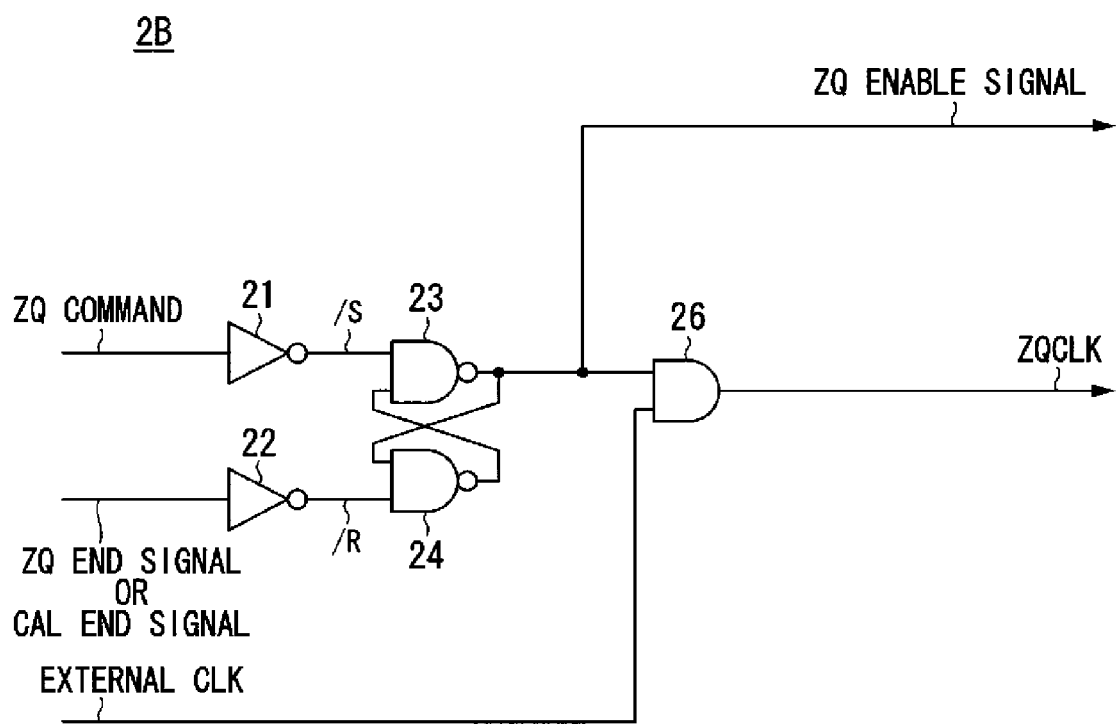
FIG. 7 is a block diagram illustrating a command latch circuit included in the semiconductor device in accordance with a second preferred embodiment of the present invention.

In the present embodiment, the aforementioned command latch circuit 2A of the first embodiment is substituted with a command latch circuit 2B shown in FIG. 7.

In FIG. 7, like reference numerals denote like elements as in FIG. 2, and descriptions thereof will be selectively omitted.

The command latch circuit 2B includes inverter circuits 21 and 22, NAND circuits 23 and 24, and an AND circuit 26.

The command latch circuit 2B outputs the ZQEnable signal when the ZQ command is input. Similarly to the first embodiment, the command latch circuit 2B stops outputting the ZQEnable signal when the ZQ end signal or the CAL end signal is input.

The AND circuit 26 is an AND logic circuit which receives the ZQEnable signal and the external CLK signal and outputs the clock signal ZQCLK to the ZQ adjustment circuit 3.

The AND circuit 26 transits the logic level of the clock signal ZQCLK from 0 to 1 when the logic level of the external CLK signal is transited from 0 to 1 with the ZQEnable signal having a logic level equal to 1.

In other words, the command latch circuit 2B generates the clock signal ZQCLK having the same cycle as the external CLK signal and outputs it to the ZQ adjustment circuit 3. Although not shown in FIG. 7, the external CLK signal is input to a terminal provided in the semiconductor device 100, for example, a CLK terminal in a DRAM.

The ZQ adjustment circuit 3 performs impedance adjustment (ZQ adjustment) between an internal replica buffer and an external resistor connected to the ZQ terminal in synchronism with the clock signal ZQCLK when the ZQEnable signal is input as described in conjunction with the first embodiment.

The driver code generating circuit 32 outputs the ZQPU driver code of 5 bits to the PU replica 35 within a single cycle of the clock signal ZQCLK. The drive code generating circuit 32 repeats this operation by changing the 5-bit data until the PU hit signal is input from the ZQ level comparator 34.

Subsequently, the driver code generating circuit 32 outputs the ZQPD driver code of 5 bits to the PD replica 37.

The driver code generating circuit 32 repeats this operation by changing the 5-bit data until the PD hit signal is input from the ZQ level comparator 34.

When both the PU hit and PD hit signals are input, the driver code generating circuit 32 outputs the CAL end signal representing termination of the ZQ adjustment and the adjustment results as the DQPU driver code and the DQPD driver code.

The ZQ adjustment circuit 3 outputs the ZQ end signal when the internal counter circuit 38 counts the clock number of the clock signal ZQCLK up to a predetermined number.

During such an adjustment period, the DQ circuit 4 outputs the DQ signal to the input/output pin in response to the logic level of the ZQEnable signal.

Through the aforementioned process, the logic level of the ZQEnable signal becomes 1 during a time obtained by multiplying the cycle of an external clock signal CLK by the count number set in the counter circuit 38 because the ZQCLK signal is synchronized with the external CLK signal when the ZQ end signal is input to the command latch circuit 2B.

Accordingly, the logic level of the DQ signal corresponding to the output of the DQ circuit 4 becomes 1.

When the CAL end signal is input to the command latch circuit 2B, the logic level of the ZQEnable signal becomes 1 until the calibration is terminated.

Accordingly, the logic level of the DQ signal corresponding to the output of the DQ circuit 4 becomes 1.

In any case, since the adjustment time for each try is synchronized with the external clock signal CLK, the calibration period is changed by changing the period of the external clock signal CLK.

As described above, the semiconductor device 100 according to the present embodiment has an impedance adjustment circuit (for example, the ZQ adjustment circuit 3) which generates a driver code (for example, the DQPU driver code and the DQPD driver code) for changing the driver size of the output buffer (for example, the PU circuit 46 and the PD circuit 47) and outputs the driver code to the output buffer (for example, the PU circuit 46 and the PD circuit 47). The semiconductor device 100 according to the present embodiment also has a signal generating circuit (for example, the command latch circuit 2B) which generates an impedance adjustment command signal (for example, the ZQEnable signal) representing start and termination of the impedance adjustment in the impedance adjustment circuit (for example, the ZQ adjustment circuit 3) to output a signal synchronized with the impedance adjustment command signal (for example, the ZQEnable signal) to an output terminal (for example, the input/output pin) connected to the output buffer (for example, the PU circuit 46 and the PD circuit 47).

The signal generating circuit (for example, the command latch circuit 2B) transits the impedance adjustment command signal (for example, the ZQEnable signal) from a first logic level to a second logic level in response to the calibration command input from an external device. Meanwhile, the signal generating circuit activates the impedance adjustment circuit (for example, the ZQ adjustment circuit 3) and transits the impedance adjustment command signal (for example, the ZQEnable signal) from the second logic level to the first logic level in response to a drive code generation termination signal (for example, the ZQ end signal or the CAL end signal) input from the impedance adjustment circuit (for example, the ZQ adjustment circuit 3).

The impedance adjustment circuit (for example, the ZQ adjustment circuit 3) includes a control circuit (for example, the ZQ control circuit 31) which initiates impedance adjustment when the impedance adjustment command signal (for example, the ZQEnable signal) is transited from the first logic level to the second logic level, a driver code generating circuit (for example, the driver code generating circuit 32) which generates a driver code (for example, the DQPU driver code and the DQPD driver code) of an output buffer (for example, the PU circuit 46 and the PD circuit 47) in response to a clock signal (for example, the ZQCLK) output from the signal generating circuit (for example, the command latch circuit 2B), and a replica buffer (for example, the PU replicas 35 and 36 and the PD replica 37) including a group of transistors identical to a plurality of transistors (P-channel MOS transistors 221 to 226 and N-channel MOS transistors 231 to 236) constituting an output buffer (for example, the PU circuit 46 and the PD circuit 47). The driver code generating circuit (for example, the drive code generating circuit 32) generates a driver code (for example, the DQPU driver code and the DQPD driver code) and outputs it to the output buffer (for example, the PU circuit 46 and the PD circuit 47) based on the ON/OFF information of a group of transistors included in the replica buffer (for example, the PU replicas 35 and 36, and the PD replica 37) when the impedance value of the replica buffer (for example, the PU replicas 35 and 36, and the PD replica 37) is changed and approaches a predetermined impedance value. Additionally, the driver code generating circuit generates a driver code generation termination signal (for example, the CAL end signal).

The control circuit (for example, the ZQ control circuit 31) generates a driver code generation termination signal (for example, the ZQ end signal) when an internal counter (for example, the counter circuit 38) counts the clock signal ZQCLK, and the count number reaches a predetermined number.

The signal generating circuit (for example, the command latch circuit 2A) has an oscillator circuit (for example, the OSC circuit 25) which initiates oscillation when the impedance adjustment command signal (for example, the ZQEnable signal) is transited from the first logic level to the second logic level and outputs the clock signal ZQCLK.

The signal generating circuit (for example, the command latch circuit 2B) outputs the clock signal ZQCLK in synchronism with a signal (for example, the external clock CLK) periodically input from an external device outside the semiconductor device after the impedance adjustment command signal (for example, the ZQEnable signal) is transited from the first logic level to the second logic level.

As a result, it is possible to measure a calibration period (for example, the impedance adjustment period) while the logic level of the signal (for example, the DQ signal) output to the output terminal (for example, the input/output pin) connected to the output buffer circuit (for example, the PU circuit 46 and the PD circuit 47) remains in 1, for example, by measuring a potential change in the input/output pin using a tester.

In addition to the aforementioned effects, when the CAL end signal is input to the inverter circuit 22 of the command latch circuit 2B, it is possible to obtain a period required by the ZQ adjustment circuit 3 to perform the calibration in practice with high accuracy, for example, by changing the cycle of the external clock CLK using a tester.

The term "configured" is used to describe a component, section or part of a device includes hardware and/or software that is constructed and/or programmed to carry out the desired function.

It is apparent that the present invention is not limited to the above embodiments, but may be modified and changed without departing from the scope and spirit of the invention.

What is claimed is:

1. A semiconductor device, comprising:
   a signal generating circuit that generates an impedance adjustment command signal which indicates at least one of initiation and termination of an impedance adjustment; and
   an impedance adjusting circuit that performs an impedance adjustment based on the impedance adjustment command signal from the signal generating circuit,
   wherein the semiconductor device outputs an output signal in synchronism with the impedance adjustment command signal, the impedance adjusting circuit generates a driver code which changes a driver size of the output buffer, the impedance adjusting circuit supplies the driver code to an output buffer, and the signal generating circuit causes the impedance adjustment command signal to be transitioned from a first logic level to a second logic level, so as to activate the impedance adjusting circuit, the signal generating circuit causes the impedance adjustment command signal to be transitioned from the second logic level to the first logic level, in response to a driver code generation termination signal given by the impedance adjusting circuit.

2. The semiconductor device according to claim 1, wherein the impedance adjusting circuit comprises:
   a driver code generating circuit that generates the driver code in response to a first clock given by the signal generating circuit.

3. The semiconductor device according to claim 2, wherein the impedance adjusting circuit further comprises:
   a replica buffer which includes a first plurality of transistors which are replicated to a second plurality of external transistors which forms the output buffer,
   wherein the driver code generating circuit adjusts an impedance of the replica buffer, and the driver code generating circuit generates the driver code which is related to the results of the adjustment of the impedance.

4. The semiconductor device according to claim 3, wherein when the impedance of the replica buffer approaches a predetermined value, the driver code generating circuit generates the driver code to supply the driver code to the output buffer, while generating the driver code generation termination signal.

5. The semiconductor device according to claim 3, wherein the driver code generating circuit generates the driver code based on information related to the first plurality of transistors of the replica buffer.

6. The semiconductor device according to claim 3, wherein the impedance adjusting circuit further comprises:
   a control circuit that starts the impedance adjustment, in response to the transition of the impedance adjustment command signal from the first logic level to the second logic level.

7. The semiconductor device according to claim 6, wherein the control circuit comprises a counter that counts the first clock up to a predetermined number, when the number counted by the counter reaches the predetermined number, the control circuit generates the driver code generation termination signal.

8. The semiconductor device according to claim 6, wherein the signal generating circuit comprises an oscillator circuit that starts oscillation and generates the first clock, in response to the transition of the impedance adjustment command signal from the first logic level to the second logic level.

9. The semiconductor device according to claim 6, wherein the signal generating circuit outputs the first clock, in synchronism with an external signal which is given cyclically and externally, after the transition of the impedance adjustment command signal from the first logic level to the second logic level.

10. A semiconductor device, comprising:
    a signal generating circuit that generates an impedance adjustment command signal which indicates at least one of initiation and termination of an impedance adjustment,
    wherein the semiconductor device outputs an output signal in synchronism with the impedance adjustment command signal, and the signal generating circuit generates the impedance adjustment command signal, in response to a test mode signal.

11. The semiconductor device according to claim 10, further comprising:
    an impedance adjusting circuit that performs an impedance adjustment based on the impedance adjustment command signal from the signal generating circuit.

12. The semiconductor device according to claim 11, wherein the impedance adjusting circuit generates a driver code which changes a driver size of the output buffer, the impedance adjusting circuit supplies the driver code to an output buffer.

13. The semiconductor device according to claim 12, further comprising:
    an output terminal connected to the output buffer,
    wherein the semiconductor device supplies the output signals to the output terminal.

14. The semiconductor device according to claim 10, further comprising:
    an impedance adjusting circuit that performs an impedance adjustment on an output buffer,
    wherein the signal generating circuit activates the impedance adjustment command signal in accordance with a start signal, the signal generating circuit deactivates the impedance adjustment command signal in accordance with a termination signal, the signal generating circuit outputs the impedance adjustment command signal to the output buffer.

15. A method, comprising:
    generating an impedance adjustment command signal;
    performing at least one of initiation and termination of an impedance adjustment on an output buffer;
    producing an output signal in synchronism with the impedance adjustment command signal;
    performing a first impedance adjustment on a replica buffer with reference to an external resistive element; and
    performing a second impedance adjustment on an output impedance of the output buffer.

16. A semiconductor device, comprising:
    a terminal configured to communicate with an external unit that is to be provided outside the device;
    a signal generating circuit generating an impedance adjustment command signal that indicates at least one of initiation and termination of an impedance adjustment;
    a utilization circuit coupled to the signal generating circuit to receive the impedance adjustment command signal, the utilization circuit being subject to an impedance adjustment operation in response to the impedance adjustment command signal; and a control circuit allowing a signal related to the impedance adjustment command signal to appear at the terminal, wherein the utilization circuit includes an output buffer that is coupled to the terminal and has impedance adjustable by the impedance adjustment operation, and the control circuit controls the output buffer to drive the terminal in response to the impedance adjustment command signal so that the signal related to the impedance adjustment command signal appears at the terminal, and wherein the output buffer is configured to receive a data signal so that the output buffer further drives the terminal in response to the data signal with the impedance adjustable by the impedance adjustment operation.

17. The device as claimed in claim 16, wherein the control circuit comprises a selector selecting one of the impedance adjustment command signal and the data signal.

18. A semiconductor device, comprising:

a terminal configured to communicate with an external unit that is to be provided outside the device;

a signal generating circuit generating an impedance adjustment command signal that indicates at least one of initiation and termination of an impedance adjustment;

a utilization circuit coupled to the signal generating circuit to receive the impedance adjustment command signal, the utilization circuit being subject to an impedance adjustment operation in response to the impedance adjustment command signal; and a control circuit allowing a signal related to the impedance adjustment command signal to appear at the terminal, wherein the control circuit is supplied with a test signal and is activated when the test signal indicates a test mode to allow the signal related to the impedance adjustment command signal to appear at the terminal.

* * * * *